United States Patent [19]

Sakiyama et al.

[11] Patent Number: 5,315,233
[45] Date of Patent: May 24, 1994

[54] ELECTROMAGNETIC FIELD ANALYZER FOR DEVICES IN WHICH AN ELECTROMAGNETIC FIELD IS PRESENT NEAR A CONDUCTOR AND AN ELECTRIC CHARGE MOVES IN THE ELECTROMAGNETIC FIELD, AND METHOD OF ANALYZING AN ELECTROMAGNETIC FIELD

[75] Inventors: Kazuyuki Sakiyama, Moriguchi; Akira Ahagon, Neyagawa; Hidetoshi Kotera, Toyonaka; Hiromi Kita, Kashihara, all of Japan

[73] Assignee: Matsushita Electric Industrial Co., Ltd., Osaka, Japan

[21] Appl. No.: 699,513

[22] Filed: May 14, 1991

[30] Foreign Application Priority Data

May 16, 1990 [JP] Japan ................................ 2-127365

[51] Int. Cl.$^5$ ................. G01R 29/08; G01R 33/02; H01J 25/00
[52] U.S. Cl. .................................. 324/72; 324/250; 324/260; 250/397
[58] Field of Search ................. 324/72, 244, 250, 260, 324/457; 250/396 ML, 396 R, 397, 398

[56] References Cited

FOREIGN PATENT DOCUMENTS

| 542266 | 1/1977 | U.S.S.R. |
| 656128 | 4/1979 | U.S.S.R. |
| 693476 | 10/1979 | U.S.S.R. |
| 752552 | 7/1980 | U.S.S.R. |
| 9012413 | 10/1990 | World Int. Prop. O. |

*Primary Examiner*—Gerard R. Strecker
*Assistant Examiner*—Diep Do
*Attorney, Agent, or Firm*—Beveridge, DeGrandi, Weilacher & Young

[57] ABSTRACT

In order to take into account the effect of load resistance applied to an electromagnetic field in analyzing an electromagnetic wave oscillator, the present invention arranges a resistance equivalent to the load resistance in the analytical region, and converts a voltage applied to the load and the current flowing therein into an electric field component and a magnetic field component to analyze the electromagnetic field distribution of the entire analytical region. The motion of an electrical charge is thus analyzed taking into account a force applied to the electric charge by the electromagnetic field distribution. This compound analysis of both the electric charge motion and the electromagnetic field is alternately and repeatedly performed.

4 Claims, 4 Drawing Sheets

ELECTROMAGNETIC FIELD ANALYZER FOR DEVICES IN WHICH AN ELECTROMAGNETIC FIELD IS PRESENT NEAR A CONDUCTOR AND AN ELECTRIC CHARGE MOVES IN THE ELECTROMAGNETIC FIELD, AND METHOD OF ANALYZING AN ELECTROMAGNETIC FIELD

BACKGROUND OF THE INVENTION

1. Field of the Invention

The present invention relates to an electromagnetic field analyzer for electromagnetic wave oscillators, such as klystons and magnetrons, and to a method of analyzing an electromagnetic field.

2. Description of the Related Art

A general method of analyzing the motion of an electric charge (or electron) in an electromagnetic field is known. One such analytical method includes a method for analyzing the trajectory of the electric charge in an electromagnetic field not changing with respect to time (N. J. Diserens, "A space charge beam option for the PE2D and TOSCA packages", IEEE Transactions on Magnetics, vol. Mag-18, No. 2, March, 1982).

Also, another analytical method is known which is used to analyze the operation of electromagnetic wave oscillators. In this method, an electromagnetic field that is changing with respect to time is analyzed every moment in an unloaded condition. The results are used to analyze the motion of the electric charge therein (J. Rodney, M. Vaughan, "A model for calculation of magnetron performance", IEEE Transactions on Electron Devices, vol. ED-20, No. 9, September, 1973).

However, in the above-mentioned methods, no electromagnetic field analysis can be performed taking into account the effect of the load resistance applied to the electromagnetic wave oscillators when operated. That is, load resistance when the electromagnetic wave oscillator is operated affects the motion of the electric charge in the oscillator. Such phenomenon cannot also be analyzed.

SUMMARY OF THE INVENTION

The object of the present invention is to provide an electromagnetic field analyzer capable of performing the compound analyses of both electric charge motion and the electromagnetic field, taking into account the effect of the load resistance applied to the electromagnetic field.

That is, the invention relates to an electromagnetic field analyzer for devices in which an electromagnetic field is present near a conductor and an electric charge (electron) moves in the electromagnetic field comprising:

input means for setting an initial condition for electric charge motion analysis and a boundary condition for electromagnetic field analysis;

electric charge motion analysis means for analyzing a position and velocity of an electric charge at a specific time based on data input from the input means;

magnetic field analysis means for determining a distribution of a magnetic field by utilizing the results obtained by the electric charge motion analysis means;

equivalent current analysis means for determining an intensity of a magnetic field at a position where an equivalent resistance to deal equivalently with a load resistance applied to the electromagnetic field is arranged on a boundary of an analytical region by utilizing the results obtained by the magnetic field analysis means, and to determine a current flowing through the equivalent resistance from the boundary condition at the conductor surface;

voltage drop analysis means for determining a voltage drop across the equivalent resistance based on the current flowing through the equivalent resistance obtained from the equivalent current analysis means;

electric field intensity analysis means for analyzing an electric field intensity at the load resistance position based on the results analyzed by the voltage drop analysis means;

electric field analysis means for determining an electric field based on information obtained by the electric field intensity analysis means; and control means for repeating drives of all or part of each means by following a time lapsing, based on results analyzed thereby.

In order to take into account the effect of the load resistance applied to an electromagnetic field in analyzing an electromagnetic wave oscillator by compounding electromagnetic field analysis and electric charge motion analysis, the present invention arranges a resistance equivalent to the load resistance in an analytical region, and converts the voltage applied to the load and the current flowing therein into an electric field component and a magnetic field component to analyze the electromagnetic field distribution of the entire analytical region. The motion of an electric charge is analyzed taking into account the force applied to the electric charge by the electromagnetic field distribution. Such compound analyses of both electric charge motion and electromagnetic field are alternately and repeatedly performed by a large-size electronic analyzer.

Thus, the present invention can analyze quantitatively the electromagnetic field distribution and the electric charge motion every moment in an electromagnetic wave oscillator when the oscillator operates while being subjected to a load, and accordingly, is an analyzer adapted for actual devices.

DESCRIPTION OF THE PREFERRED EMBODIMENTS

With reference to drawings, embodiments of the present invention are explained hereinafter.

Figure 1:
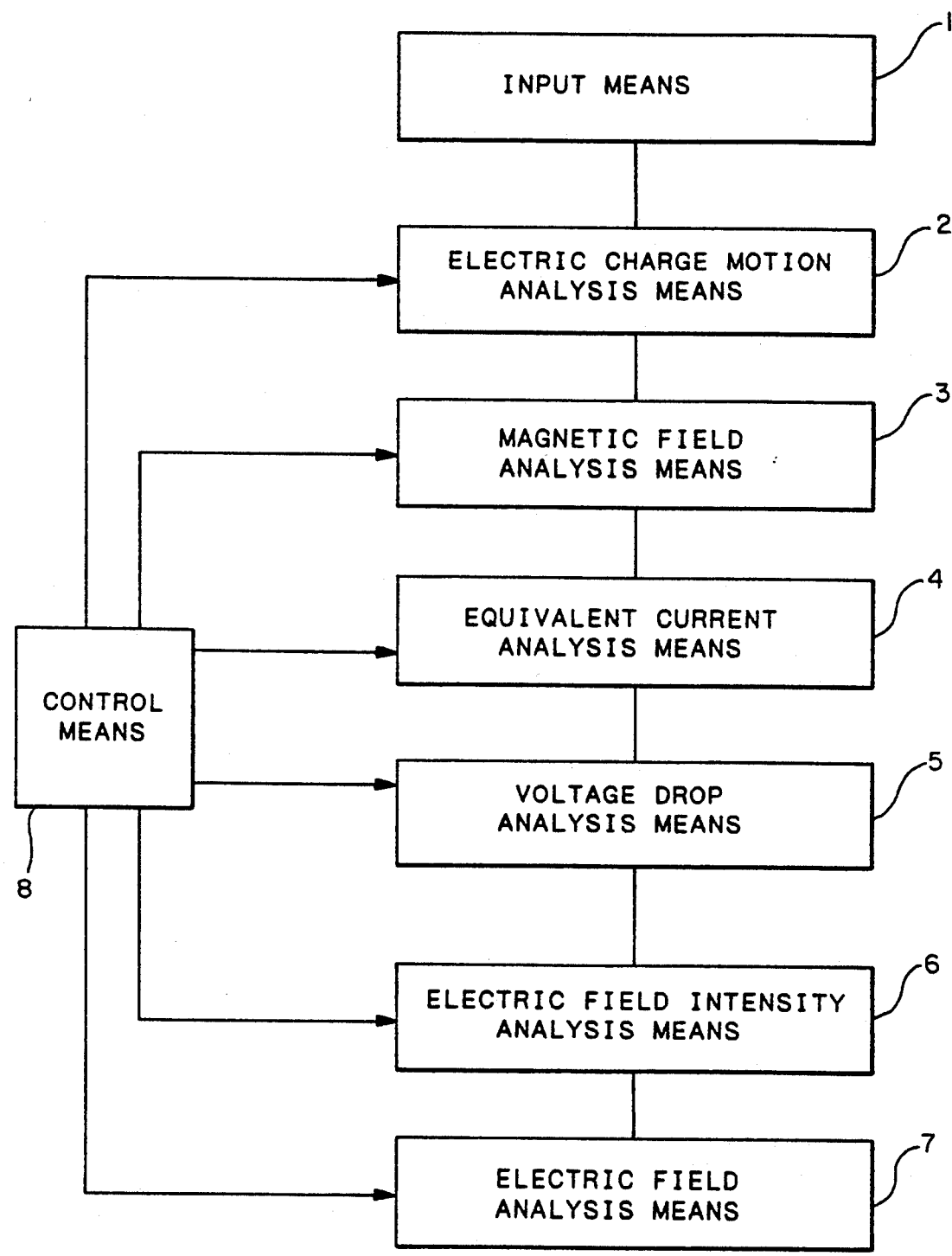
FIG. 1 is a block diagram showing an electromagnetic field analyzer of one embodiment in the present invention.

FIG. 1 is a block diagram showing an electromagnetic field analyzer in one embodiment of the present invention.

Figure 3:
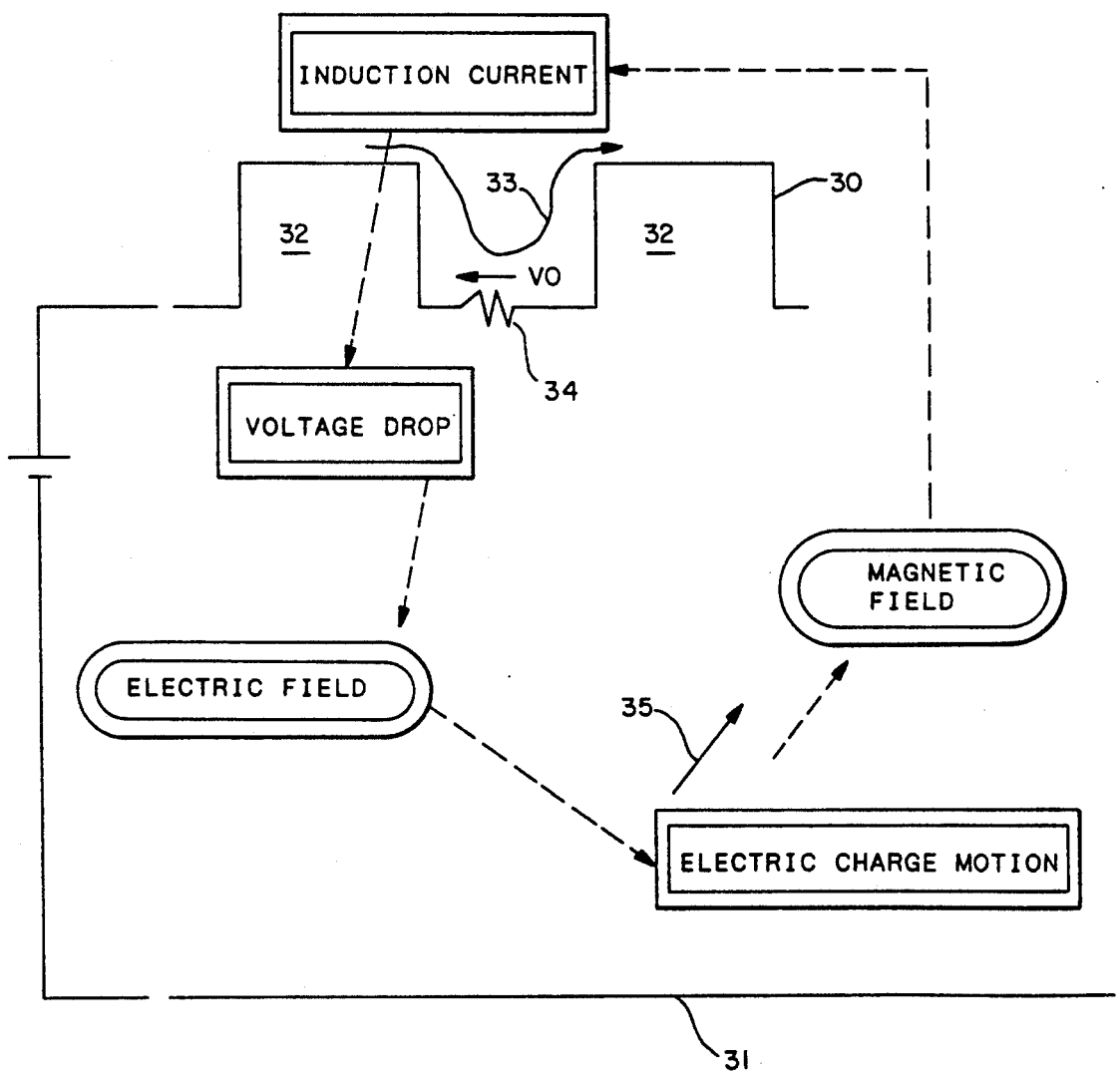
FIG. 3 is a typical view, partially in cross-section, of a magnetron in the embodiment.

FIG. 3 is a view, partially in cross-section, of a magnetron analyzed by utilizing the electromagnetic field analyzer. A voltage has been applied between an anode 30 forming a resonance section 32 and a cathode 31. An equivalent load resistance 34 is put in a place where an antenna is present. A magnetic field has been applied perpendicularly to the plane of the paper on which FIG. 3 is drawn, i.e., into and out of the plane of the sheet of paper.

When an electric charge is emitted from the cathode 31, an electric field is changed accordingly, and a magnetic field also is changed. At the same time, a current 33, in synchronism with the motion of the electric charge 35, flows along the anode 30. The presence of the load resistance 34 causes a voltage drop to be developed. The synchronization of the current with the electric charge is deviated accordingly.

Under such circumstance, the electromagnetic field analyzer of the present invention performs analysis.

That is, input means 1 for setting the initial condition for electric charge motion analysis and the boundary condition for electromagnetic field analysis is, for example, a keyboard.

Electric charge motion analysis means 2 is used to analyze the position and velocity of an electric charge at a time t. With the position and velocity of the electric charge obtained therefrom, an electric charge density distribution $\rho$ and a current density distribution J are determined.

Magnetic field analysis means 3 is used to solve the wave equation for the magnetic field shown in the following Equation (1), by use of the finite element so as to determine the distribution of a magnetic field H.

$$\nabla^2 H - \mu\epsilon \frac{\partial^2 H}{\partial t^2} = -rotJ \qquad (1)$$

As another method of analyzing the magnetic field distribution, the difference calculus method or the boundary element method can be used, instead of the finite element method.

Figure 4:
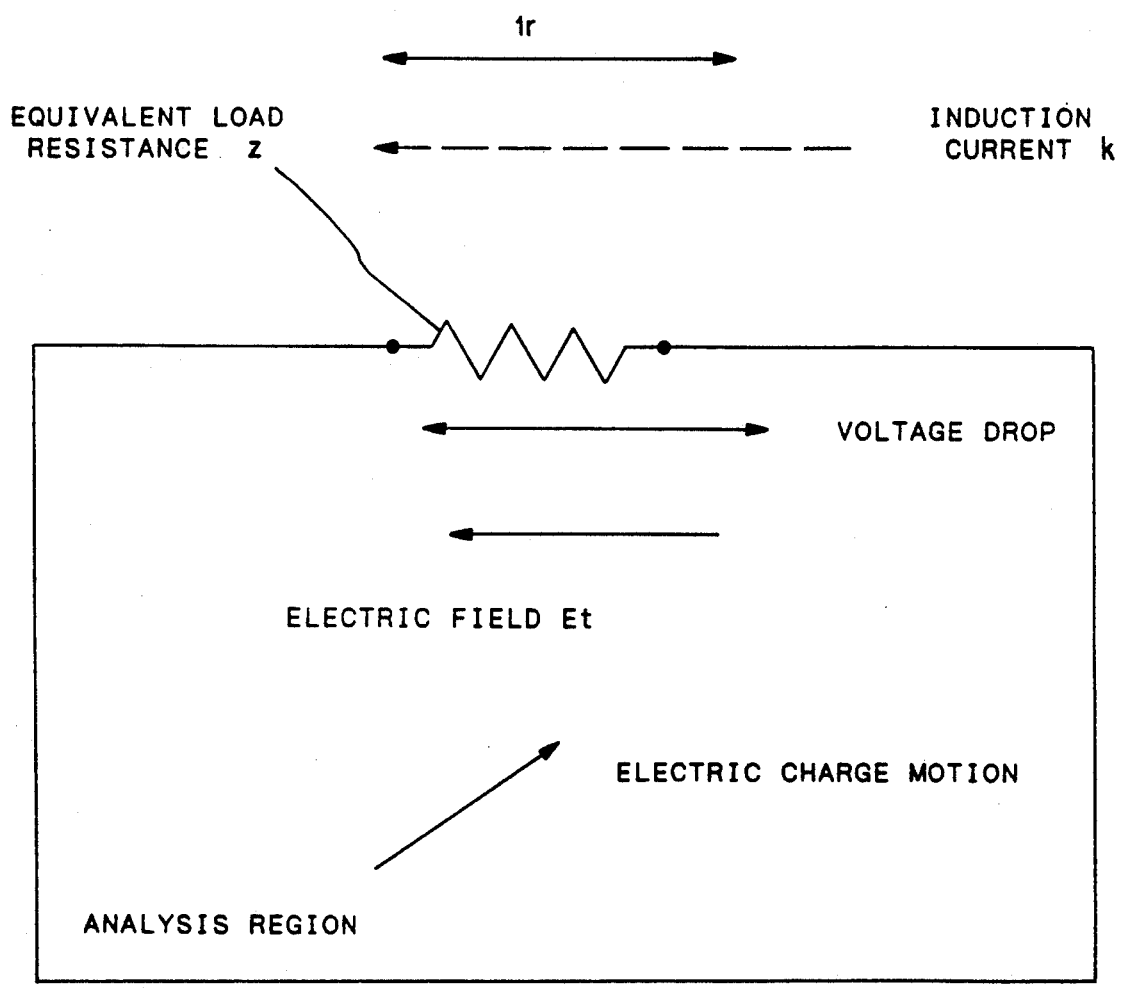
FIG. 4 is a conceptual view showing the modeling of the load resistance in a portion of the magnetron.

FIG. 4 is a view modeling the magnetron in FIG. 3. That is, when a resistance model to deal equivalently with the load resistance applied to the electromagnetic field is arranged on the boundary of an analysis region as shown in FIG. 4, equivalent current analysis means 4 is used to determine the intensity of the magnetic field at the arranged position by utilizing the results obtained by the magnetic field analysis means 3, and to determine a current i flowing through the resistance from the boundary condition at a conductor surface, as shown in Equations (2) and (3) as follows:

$$Ht = k \qquad (2)$$

$$i = k\ hr \qquad (3)$$

In the above Equations, the boundary conditions is shown in Equation 2, wherein Ht is the tangential component of the magnetic field to the boundary and k is the face current density of the induced current at the boundary. In Equation 3, which is used to calculate the current i, hr is the width through which the induced current flows. The boundary is not always the surface of the anode 30, and may be somewhat inside thereof.

Voltage drop analysis means 5 is used to determine a voltage drop Vr across the equivalent load resistance by Equation (4), based on the current i flowing through the equivalent load resistance obtained from the equivalent current analysis means 4. Equation (4) is as follows:

$$Vr = zi \qquad (4)$$

wherein z is the impedance of the equivalent load resistance.

Electric field intensity analysis means 6 is used to analyze the electric field intensity at the load resistance position, whereby a tangential electric field Et determined by Equation (5) can be obtained at the boundary position, taking into account the load for the equivalent load resistance. Equation (5) is as follows:

$$Et = Vr/lr \qquad (5),$$

wherein lr is the distance across the position where the equivalent resistance is arranged.

For example, where the boundary subjected to the load is a conductor, $Vr = 0$ is an unloaded condition from Equation (4), whereby the tangential component Et of the electric field is zero, and thus no effect of the load resistance appears on the electromagnetic field. On the contrary, in a loaded condition, the tangential component of the electric field Et affects the electric field distribution in the analytical region. Electric field analysis means 7 is used to determine an electric field, and can take into account the fact by incorporating Et in the boundary condition to analyze the electric field. To analyze an electric field E, the wave equation with respect to the electric field shown in the following Equation (6) is used, and then the electric field distribution can be obtained by the finite element method.

$$\nabla^2 E - \mu\epsilon \frac{\partial^2 E}{\partial t^2} = \frac{1}{\epsilon} gard\rho + \mu \frac{\partial J}{\partial t} \qquad (6)$$

Control means 8 is used to control the drive of all or part of the above-mentioned means, for example, to repeat the operation of the magnetic field analysis means 2 and the following means following a time lapsing. This allows the analytical information on the motion of the electric charge in the electromagnetic field affected by the load resistance to be obtained.

The operation of the above-mentioned embodiment will be explained hereinafter, particularly with reference to FIG. 2.

Figure 2:
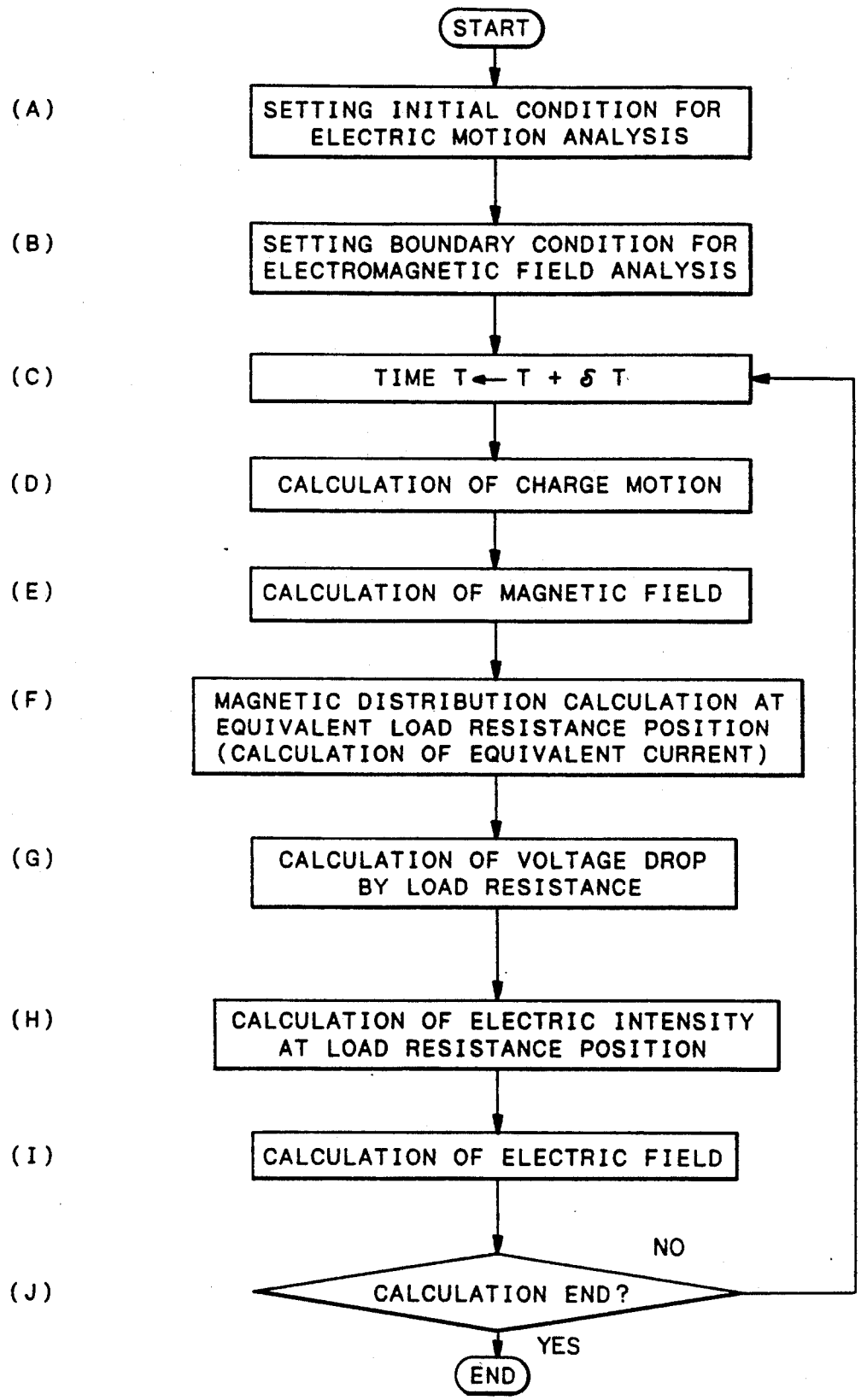
FIG. 2 is a flowchart showing the operation of the embodiment.

FIG. 2 is a flowchart showing the operation of the analyzer in the embodiment. The double box in FIG. 3 indicates the flow of calculation.

Step (A) is an input step for setting the initial conditions for electric charge motion analysis. Step (B) is an input step for setting the boundary condition for electromagnetic field analysis.

In step (C), the analysis time is advanced by a variation $\delta t$ for time integration analysis.

In step (D), a processing is performed to obtain the position and velocity of the electric charge at a time t. From the position and velocity of the electric charge obtained therein, the electric charge density distribution $\rho$ and the current density distribution J are converted. In step (E), the wave equation for a magnetic field shown in the above-mentioned Equation (1) is solved by use of the finite element method to determine the information on the distribution of the magnetic field H.

In step (F), when a resistance model to deal equivalently with the load resistance applied to the electromagnetic field is arranged on the boundary on an analytical region as shown in FIG. 4, the intensity of the magnetic field at the position is determined from the analyzed results of step (E), and the current i flowing through the resistance is obtained from the boundary condition at the conductor surface shown in Equation (2), wherein the current i is calculated as shown in Equation (3).

Since the current i flowing through the equivalent load resistance can be thus determined, in step (G), the voltage drop Vr across the equivalent load resistance is obtained by Equation (4).

Accordingly, in step (H), the tangential electric field Et determined by Equation (5) develops at the boundary position taking into account the load for the equivalent load resistance.

For example, where the boundary subjected to the load is a conductor, Vr=0 in an unloaded condition by Equation (4), whereby the tangential component Et of the electric field is zero, and thus no effect of the load resistance appears on the electromagnetic field. On the contrary, in a loaded condition, Et affects the electric field distribution in the analytical region. This fact can be taken into account by incorporating Et in the boundary condition to analyze the electric field in step (I). To analyze an electric field E, the wave equation with respect to an electric field shown in Equation (6) is used, and then the electric field distribution is obtained by the finite element method.

Further, by returning the analysis back to step (C) to repeat the analysis following a time lapsing, an analysis can be performed of the motion of the electric charge in the electromagnetic field affected by the load resistance, as well as an analysis of the electric field and the magnetic field.

Although each means of the present invention may be implemented in software or firmware by using a computer, of course, they also may be implemented by using a special hardware circuit.

As explained previously, according to the present invention, the operation of an electromagnetic wave oscillator in a loaded condition can be analyzed, whereby the motion of an electric charge in the oscillator can be quantitatively analyzed.

While the preferred form of the present invention has been described, it is to be understood that modifications will be apparent to those skilled in the art without departing from the spirit of the invention.

What is claimed is:

1. An electromagnetic field analyzer for devices in which an electromagnetic field is present near a conductor and an electric charge moves in the electromagnetic field, comprising:

resistance means located at a boundary of an analytical region for providing an equivalent to a load resistance at said boundary;

input means for inputting an initial condition for electric charge motion analysis and for inputting a boundary condition for electromagnetic field analysis;

electric charge motion analysis means for analyzing a position and velocity of an electric charge present within said analytical region at a specific time based on data input from said input means;

magnetic field analysis means for determining a distribution of a magnetic field present within said analytical region by utilizing results obtained by said electric charge motion analysis means;

equivalent current analysis means for determining an intensity of a magnetic field at said resistance means by utilizing results obtained by said magnetic field analysis means, said equivalent current analysis means further determining a current flowing through said resistance means from the boundary condition at the conductor surface;

voltage drop analysis means for determining a voltage drop across said resistance means based on the current flowing through said resistance means obtained from said equivalent current analysis means;

electric field intensity analysis means for analyzing an electric field intensity at said location of said resistance means based on results analyzed by said voltage drop analysis means;

electric field analysis means for determining an electric field based on information obtained by said electric field intensity analysis means; and control means for driving said electric charge motion analysis means, said magnetic field analysis means, said equivalent current analysis means, said voltage drop analysis means, said electric field intensity analysis means, and said electric field analysis means, and for repeating the driving of all or part of said electric charge motion analysis means, said magnetic field analysis means, said equivalent current analysis means, said voltage drop analysis means, said electric field intensity analysis means, and said electric field analysis means following a time lapsing.

2. An electromagnetic field analyzer in accordance with claim 1, wherein at least one of said electric field analysis means or said magnetic field analysis means uses a finite element analysis method.

3. A method for analyzing an electromagnetic field for a klystron or magnetron device in which an electromagnetic field is present near a conductor and an electric charge moves in the electromagnetic field, comprising:

(a) providing a resistance at a boundary of an analytical region, wherein said resistance is an equivalent to a load resistance at said boundary;

(b) inputting information for setting an initial condition for electric charge motion analysis and for setting a boundary condition for electromagnetic field analysis;

(c) analyzing a position and velocity of an electric charge present within said analytical region at a specific time based on the information input in step (b);

(d) determining a distribution of a magnetic field present within said analytical region by utilizing the position and velocity of the electric charge determined in step (c);

(e) determining an intensity of a magnetic field at said resistance by using results obtained from step (d);

(f) determining a current flowing through said resistance from the boundary condition at the conductor surface;

(g) determining a voltage drop across said resistance based on the current flowing through said resistance obtained from step (f);

(h) analyzing an electric field intensity at a position where said resistance is located based on results obtained in step (g);

(i) determining an electric field based on information obtained in step (h); and (j) repeating steps (c) to (i).

4. A method for analyzing an electromagnetic field in accordance with claim 3, wherein:

at least one of steps (d) or (i) is performed using a finite element analysis method.

* * * * *